(12) United States Patent
Rao et al.

(10) Patent No.: US 9,011,591 B2
(45) Date of Patent: Apr. 21, 2015

(54) COMPOSITIONS AND ANTIREFLECTIVE COATINGS FOR PHOTOLITHOGRAPHY

(75) Inventors: Yuanqiao Rao, Lake Jackson, TX (US); Robert L. Auger, Midland, MI (US); John D. Weaver, Pearland, TX (US); Paul J. Popa, Auburn, MI (US); Roxanne M. Jenkins, Sugar Land, TX (US); Christopher P. Sullivan, Halifax, MA (US); Jessica P. Evans, Lake Jackson, TX (US); Cecilia W. Kiarie, Marlborough, MA (US); Yasmin N. Srivastava, Sugar Land, TX (US); Jeffrey L. Fenton, Jr., Lake Jackson, TX (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 51 days.

(21) Appl. No.: 13/596,191

(22) Filed: Aug. 28, 2012

(65) Prior Publication Data

US 2013/0071560 A1 Mar. 21, 2013

Related U.S. Application Data

(60) Provisional application No. 61/537,098, filed on Sep. 21, 2011.

(51) Int. Cl.
  C08G 77/22 (2006.01)
  G03F 7/075 (2006.01)
  G03F 7/09 (2006.01)

(52) U.S. Cl.
  CPC .............. *G03F 7/0752* (2013.01); *G03F 7/091* (2013.01)

(58) Field of Classification Search
  USPC ........... 106/287.11, 287.14, 287.15; 428/447; 528/21, 32, 39, 43
  See application file for complete search history.

(56) References Cited

U.S. PATENT DOCUMENTS

| 4,442,197 | A | 4/1984 | Crivello et al. |
| 4,624,912 | A | 11/1986 | Zweifel et al. |
| 5,100,503 | A | 3/1992 | Allman et al. |
| 5,128,232 | A | 7/1992 | Thackeray et al. |
| 5,344,742 | A | 9/1994 | Sinta et al. |
| 5,621,034 | A | 4/1997 | Mautner |
| 6,042,997 | A | 3/2000 | Barclay et al. |
| 6,057,083 | A | 5/2000 | Taylor et al. |
| 6,268,457 | B1 | 7/2001 | Kennedy et al. |
| 7,105,266 | B2 | 9/2006 | Barclay et al. |
| 7,276,323 | B2 | 10/2007 | Feiring et al. |
| 7,303,785 | B2 | 12/2007 | Ogihara et al. |
| 7,417,104 | B2 | 8/2008 | Iwabuchi et al. |
| 7,736,837 | B2 | 6/2010 | Abdallah et al. |
| 2001/0032568 | A1* | 10/2001 | Schutt ...................... 106/287.11 |
| 2005/0031964 | A1 | 2/2005 | Babich et al. |
| 2005/0277058 | A1 | 12/2005 | Iwabuchi et al. |
| 2005/0277756 | A1 | 12/2005 | Iwabuchi et al. |
| 2007/0185298 | A1 | 8/2007 | Baikerikar et al. |

(Continued)

FOREIGN PATENT DOCUMENTS

| EP | 0164248 A2 | 12/1985 |
| EP | 01008913 A1 | 6/2000 |
| WO | 2010/087233 | * 8/2010 |

*Primary Examiner* — Margaret Moore

(57) ABSTRACT

Compositions for use in microelectronic applications:

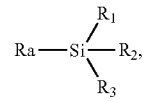

Ra comprises one or more multiple bonds, provided that, if Ra comprises more than one multiple bond, these multiple bonds are not in a conjugated configuration; and R1, R2, R3 are independently selected from alkoxyl, hydroxyl, halide, OC(O)R, OC(O)OR, wherein R is alkyl or a substituted alkyl; and

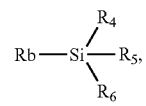

Rb is selected from H or a saturated group comprising alkyl, alkylene, or alkylidene; and R4, R5, R6 are independently alkoxyl, hydroxyl, halide, OC(O)R, OC(O)OR, wherein R is alkyl or a substituted alkyl; and

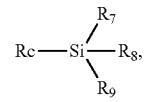

Rc comprises more than one multiple bond, and these multiple bonds are in a conjugated configuration; and R7, R8, R9 are independently alkoxyl, hydroxyl, halide, OC(O)R, OC(O)OR, wherein R is alkyl or a substituted alkyl; and

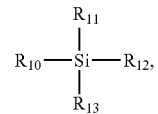

R10, R11, R12, R13 are independently alkoxyl, hydroxyl, halide, OC(O)R, OC(O)OR, wherein R is alkyl or a substituted alkyl.

19 Claims, 3 Drawing Sheets

(56) References Cited

U.S. PATENT DOCUMENTS

| | | | |
|---|---|---|---|
| 2008/0196626 A1* | 8/2008 | Wu et al. | 106/287.34 |
| 2008/0206578 A1* | 8/2008 | Rantala et al. | 428/447 |
| 2009/0148789 A1 | 6/2009 | Amara et al. | |
| 2010/0086872 A1 | 4/2010 | Ogihara et al. | |
| 2010/0210765 A1 | 8/2010 | Nakajima et al. | |
| 2012/0129352 A1* | 5/2012 | Mori et al. | 438/703 |

* cited by examiner

COMPOSITIONS AND ANTIREFLECTIVE COATINGS FOR PHOTOLITHOGRAPHY

The present application claims the benefit of U.S. Provisional Application No. 61/537,098, filed on Sep. 21, 2011, incorporated herein by reference.

The present invention relates to compositions, and in particular, to bottom antireflective coating compositions (or "BARCs"), for use in microelectronic applications. In the microelectronic industry there is a continual need for microchips that have smaller and more defined lithography patterns. Problems facing these developments today include deterioration of the developed photoresist profile, due to the reflection at the interface of the photoresist layer and the substrate, and the need for a thin resist layer to accommodate shorter exposure wavelengths and which has sufficient etch resistance. Antireflective coatings can be used to address the above problems. One way of fabricating antireflective coatings is through chemical vapor deposition (CVD), which is an expensive process. There is a need to simplify the lithography processing and avoid expensive vacuum coating of the antireflective layer. Thus, there is a need for compositions for antireflective coatings that have high etching selectivity, with respect to the resist, and which can be formed by spin coating processes.

U.S. Publication No. 2009/0148789 discloses silicon-containing, organic coating compositions, and particularly antireflective coating compositions, that contain chromophore moieties, such as phenyl, that are spaced from the Si atom(s). This publication also discloses silicon-containing, underlayer compositions that are formulated as a liquid (organic solvent) composition, and where at least one solvent of the solvent component comprises hydroxy groups.

U.S. Publication No. 2007/0185298 discloses a curable organosilicate composition that is employed to form one or more layers in the fabrication of electronic devices. This composition comprises the following: (a) an alkoxy or acyloxy silane having at least one group containing ethylenic unsaturation, and which is bonded to the silicon atom; (b) an alkoxy or acyloxy silane having at least one group containing an aromatic ring, and which is bonded to the silicon atom; (c) a latent acid catalyst; and (d) optionally an alkoxy or acyloxy silane having at least one C1-C6 alkyl group bonded to the silicon atom.

U.S. Pat. No. 5,621,034 discloses a storage-stable composition comprising the following: (A) organopolysiloxane resin having hydroxyl and/or alkoxy groups bonded to silicon atoms; and (B) stabilizers selected from among the following: (B1) aliphatic polycarboxylic acids having at least two carboxyl groups, and (B2) carboxylic anhydrides of aliphatic polycarboxylic acids having at least two carboxyl groups.

International Publication No. WO2009/088600 discloses silsesquioxane resins useful in antireflective coatings, where the silsesquioxane resin has the formula: $(PhSiO_{(3-x)/2}(OR')_x)_m(HSiO_{(3-x)/2}(OR')_x)_n(MeSiO_{(3-x)/2}(OR')_x)_o(RSiO_{(3-x)/2}(OR')_x)_p(R^2SiO_{(3-x)/2}OR')_x)_q$. In this formula, Ph is a phenyl group; Me is a methyl group; R is selected from a sulfur-containing organic functional group; R' is hydrogen atom or a hydrocarbon group having from 1 to 4 carbon atoms; $R^2$ is selected from ester groups, polyether groups; and polyethylene oxide groups; x has a value of 0, 1 or 2; m has a value of 0.01 to 0.97; n has a value of 0.01 to 0.97; o has a value of 0.01 to 0.97: p has a value of 0.01 to 0.97; q has a value of 0 to 0.96; and m+n+o+p+q≈1.

U.S. Pat. No. 7,417,104 discloses a porous film-forming composition comprising the following: (A) a polymer obtained by hydrolytic condensation of a hydrolyzable silane having formula (I): $R^1{}_n$—Si—$R^2{}_{4-n}$. In this formula, $R^1$ is a monovalent organic group or hydrogen, $R^2$ is a hydrolyzable group or a hydroxyl group (n is an integer from 0 to 3), a hydrolyzate thereof or a partial condensate thereof, with the proviso that at least one silicon compound has an organic crosslinkable group as $R^1$.

U.S. Publication No. 2010/0086872 discloses a "thermosetting metal oxide-containing film-forming composition" for forming a metal oxide-containing film, to be formed in a multilayer resist process used in lithography. The "thermosetting metal oxide-containing film-forming composition" comprises at least the following: (A) a metal oxide-containing compound, obtained by hydrolytic condensation of a hydrolyzable silicon compound and a hydrolyzable metal compound; (B) a thermal crosslinking accelerator; (C) a monovalent, divalent, or higher organic acid having 1 to 30 carbon atoms; (D) a trivalent or higher alcohol; and (E) an organic solvent.

U.S. Pat. No. 6,268,457 discloses anti-reflective coating materials for deep ultraviolet photolithography that include one or more organic dyes incorporated into spin-on-glass materials. Suitable dyes are strongly absorbing over wavelength ranges, around wavelengths less than 260 nm, such as 248 nm and 193 nm, which may be used in photolithography. A method of making dyed spin-on-glass materials includes combining one or more organic dyes with alkoxysilane reactants during synthesis of the spin-on-glass materials.

U.S. Publication No. 2005/0277058 discloses an antireflective film-forming composition comprising an organic solvent, a cross linking agent, and a polymer comprising a light absorbing group obtained by hydrolyzing and condensing more than one type of silicon compound, a crosslinking group, and a non-crosslinking group.

U.S. Publication 2010/0210765 discloses a composition for forming a resist underlayer film. A resist underlayer film-forming composition comprises the following: a polymer having silicon atoms in the backbone; a compound of a polycyclic structure; and an organic solvent. The compound of a polycyclic structure has at least two carboxyl groups as substituents; the two carboxyl groups are individually bonded to two carbon atoms adjacent to each other forming the polycyclic structure; and the two carboxyl groups both have an endo configuration or an exo configuration, or have a cis configuration. The polymer having silicon atoms in the backbone can be formed from a mixture of alkoxysilanes.

Additional compositions for antireflective films and/or other electronic applications are disclosed in the following references: U.S. Pat. Nos. 7,303,785, 7,736,837, 5,100,503; U.S. Publication Nos. 2005/0031964, and 2009/0148789.

However, conventional silicon-containing BARC compositions of the art fall short of the right optical properties and lithographic performance for small, critical dimension patterning (<100 nm). In addition, some of the conventional compositions contain costly and/or unstable components. For example, some compositions contain "Si—H containing" compounds, which typically are reactive with free radicals and with hydroxyl-containing compounds, such as alcohols and water. Some compositions contain organic dyes which increase the costs associated with manufacturing such compositions. Some compositions contain costly POSS (polyhedral oligomeric silsesquioxane ((RSiO1.5)8). Some compositions contain epoxy silsesquioxane which can lead to patterning defects, such as scum.

Thus, there remains a need for compositions for use as antireflective layer compositions, and which can be used to form smaller and more defined lithography patterns. There is a further need for such compositions that have a high etching selectivity with respect to the etching of a resist layer. There is a further need for cost-effective compositions that can be formed into antireflective layers using a spin coating process. These needs and others have been met by the following invention.

SUMMARY OF INVENTION

The invention provides a first composition comprising at least the following:

A) a Compound F1 selected from Formula 1:

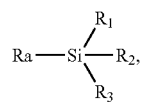

(Formula 1)

wherein Ra comprises one or more multiple bonds (that is, double bonds or triple bonds), including C=C, C≡C, C=O, C=N, and C≡N, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl; and B) a Compound F2 selected from Formula 2:

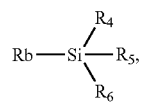

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl; and C) a Compound F3 selected from Formula 3:

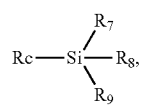

(Formula 3)

wherein Rc comprises more than one multiple bond, including C=C, C≡C, C=O, C=N, and C≡N, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and D) A Compound F4 selected from Formula 4:

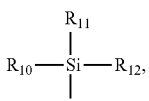

(Formula 4)

wherein R10, R11, R12, and R13 are each independently selected from alkoxyl, hydroxyl, halide, OC(O)R, or OC(O)OR, wherein R is alkyl or a substituted alkyl.

DETAILED DESCRIPTION

Figure 1:
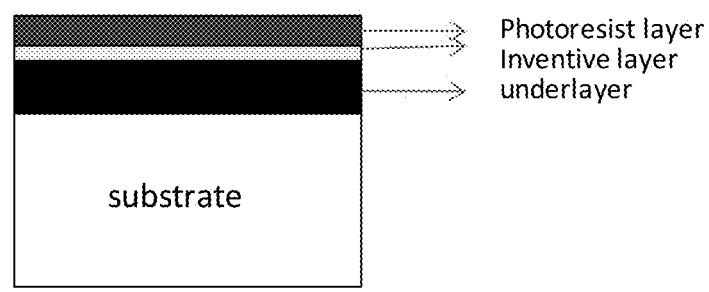
FIG. 1 depicts a schematic of a tri-layer film structure over a silicon wafer.

As discussed above, the invention provides a first composition comprising at least the following:

A) a Compound F1 selected from Formula 1:

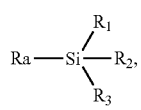

(Formula 1)

wherein Ra comprises one or more multiple bonds, including C=C, C≡C, C=O, C=N, and C≡N, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl; and B) a Compound F2 selected from Formula 2:

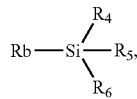

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl; and C) a Compound F3 selected from Formula 3:

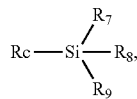

(Formula 3)

wherein Rc comprises more than one multiple bond, including C=C, C≡C, C=O, C=N, and C≡N, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and D) A Compound F4 selected from Formula 4:

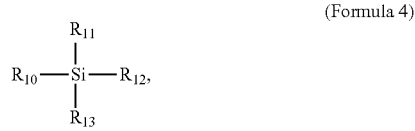

(Formula 4)

wherein R10, R11, R12, and R13 are each independently selected from alkoxyl, hydroxyl, halide, OC(O)R, or OC(O)OR, wherein R is alkyl or a substituted alkyl.

In one embodiment, the first composition comprises greater than, or equal to, 5 weight percent Si, or greater than, or equal to, 10 weight percent Si, or greater than, or equal to, 15 weight percent Si, based on the sum weight of Compounds F1, F2, F3 and F4.

In one embodiment, the sum molar amount of Compound F2 and Compound F4 is greater than, or equal to, 40 mole percent, based on the sum moles of Compounds F1, F2, F3 and F4.

In one embodiment, the sum molar amount of Compound F2 and Compound F4 is less than, or equal to, 85 mole percent, or less than, or equal to, 80 mole percent, based on the sum moles of Compounds F1, F2, F3 and F4.

In one embodiment, Compound F4 is present in an amount greater than 10 mole percent, based on the sum moles of Compounds F1, F2, F3 and F4.

In one embodiment, the molar ratio of F1/F4 is from 1/20 to 1/1, or from 1/15 to 1/1, or from 1/10 to 1/1.

In one embodiment, for the first composition, F1 ranges from 5 to 50 weight percent, or from 10 to 30 weight percent; F2 ranges from 5 to 50 weight percent, or from 10 to 40 weight percent; F3 ranges from 2 to 20 weight percent, or from 2 to 10 weight percent; F4 ranges from 20 to 80 weight percent, or from 30 to 80 weight percent. Each weight percentage is based on the weight of the first composition.

In one embodiment, for the first composition, Compound F1 is present in an amount from 10 to 90 mole percent, further from 15 to 90 mole percent, further from 20 to 90 mole percent, and further from 25 to 90 mole percent, based on the sum moles of Compounds F1, F2, F3 and F4.

In one embodiment, for the first composition, Compound F1 is present in an amount greater than 10 mole percent, further greater than 12 mole percent, based on the sum moles of Compounds F1, F2, F3 and F4.

In one embodiment, for the first composition, Compound F4 is present in an amount from 10 to 65 mole percent, further from 10 to 60 mole percent, further from 10 to 55 mole percent, and further from 10 to 50 mole percent, based on the sum moles of Compounds F1, F2, F3 and F4.

In one embodiment, for the first composition, Compound F4 is present in an amount less than 65 mole percent, further less than 60 mole percent, based on the sum moles of Compounds F1, F2, F3 and F4.

The first composition may comprise a combination of two or more embodiments as described herein.

The invention also provides a prepolymer formed from a first composition. In a further embodiment, the prepolymer is formed by at least the following: hydrolyzing the first composition to form a hydrolyzed product, and condensing the hydrolyzed product.

In one embodiment, the prepolymer has an Mw from 1,000 to 20,000 g/mole, or from 1,000 to 10,000 g/mole, or from 1,000 to 5,000 g/mole, as determined by conventional GPC.

In one embodiment, the prepolymer has an Mw/Mn from 1.1 to 6, or from 1.2 to 5, or from 1.5 to 4.

An inventive prepolymer may comprise a combination of two or more embodiments as described herein.

The invention also provides a second composition comprising an inventive prepolymer, and at least one of the following: an amine-containing compound, a halide-containing compound, a hydrochloride, an ammonium-containing compound, or a mixture thereof.

The second composition may comprise a combination of two or more embodiments as described herein.

The invention also provides a crosslinked composition formed from a second composition.

The invention also provides an article comprising at least one component formed from an inventive composition.

The invention also provides an article comprising at least one component formed from the first composition.

The invention also provides an article comprising at least one component formed from the second composition.

The invention also provides an article comprising at least one component formed from an inventive prepolymer.

In one embodiment, the article is a film.

The invention also provides a film comprising at least one layer formed from an inventive composition. In a further embodiment, the film comprises at least two layers. In a further embodiment, the second layer is formed from a third composition comprising at least one polymer.

The invention also provides a film comprising at least two layers, and wherein at least one layer is an anti-reflective layer formed from an inventive composition, such as a first composition or a second composition. In a further embodiment, the other layer is a photoresist layer.

The invention also provides a film comprising at least two layers, and wherein at least one layer is an anti-reflective layer formed from a first composition. In a further embodiment, the other layer is a photoresist layer.

The invention also provides a film comprising at least two layers, and wherein at least one layer is an anti-reflective layer formed from a second composition. In a further embodiment, the other layer is a photoresist layer.

An inventive article may comprise a combination of two or more embodiments as described herein.

An inventive film may comprise a combination of two or more embodiments as described herein.

The invention also provides a method of forming a coating on a substrate, said method comprising at least the following:
providing a substrate;
forming an underlayer on the substrate, wherein the underlayer comprises at least one polymer;
applying an inventive first composition or an inventive second composition over the underlayer; and
curing the first composition or second composition to form the coating.

In a further embodiment, the method comprises applying at least one composition, which comprises at least one photoresist polymer, over the coating.

In one embodiment, multiple layers of the first composition or second composition are applied over the underlayer.

In one embodiment, the coating is an antireflective layer.

The invention also provides a method of forming a coating on a substrate, said method comprising at least the following:
providing a substrate;

applying an inventive first composition or an inventive second composition over at least a portion of the substrate, or over one or more intermediate layers applied over said substrate; and curing the first composition or second composition to form the coating.

In a further embodiment, the method comprises applying at least one composition, which comprises at least one photoresist polymer, over the coating.

In one embodiment, multiple layers of the first composition or second composition are applied over least a portion of the substrate, or over one or more intermediate layers applied over said substrate.

In one embodiment, the coating is an antireflective layer.

An inventive method may comprise a combination of two or more embodiments as described herein.

Compounds F1-F4

Compounds F1, F2, F3 and F4 are described below.

A) A Compound F1 selected from Formula 1:

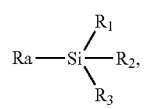
(Formula 1)

wherein Ra comprises one or more multiple bonds, including C=C, C≡C, C=O, C=N, and C≡N, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is an alkyl or a substituted alkyl. In a further embodiment, R is alkyl.

In one embodiment, Ra comprises one or more of an alkenyl group, an alkynyl group, an imide, a nitrile, a ketone, an ester, an amide, or a carbonate, and it comprises from 2 to 10 carbon atoms; and R1, R2, and R3 are each independently selected from OH, OR, or OC(O)R, wherein R is a $C_1$-$C_{10}$ alkyl or a $C_1$-$C_{10}$ substituted alkyl.

In one embodiment, Ra comprises one or more of an alkenyl group, an alkynyl group, an imide, a nitrile, a ketone, an ester, an amide, or a carbonate, and it comprises from 2 to 10 carbon atoms; and R1, R2, and R3 are each independently selected from OH, OR, or OC(O)R, wherein R is a $C_1$-$C_{10}$ alkyl.

In one embodiment, Ra is selected from vinyl, allyl, propenyl, butenyl, acetoxyl, cyanoethyl, acetoethyl, or acetamidopropyl; and, R1, R2, and R3 are each OR, wherein each R independently is selected from methyl, ethyl, n-propyl, 2-propyl, n-butyl, isobutyl, or 2-butyl.

In one embodiment, Compound F1 is selected from vinyltrimethoxysilane or vinyltriethoxysilane.

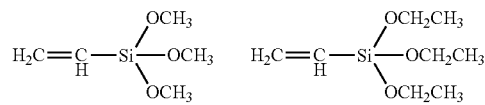

B) A Compound F2 selected from Formula 2:

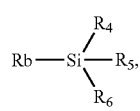
(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is an alkyl or a substituted alkyl. In a further embodiment, R is an alkyl.

In one embodiment, Rb is selected from a saturated group comprising alkyl, alkylene, or alkylidene; and, R4, R5, and R6 are each independently selected from alkoxyl, hydroxyl, halide, OC(O)R, or OC(O)OR, wherein R is an alkyl or a substituted alkyl. In a further embodiment, R is an alkyl.

In one embodiment, Rb is a saturated group comprising substituted or unsubstituted $C_1$-$C_{10}$ cyclic alkyl, a substituted or unsubstituted $C_1$-$C_{10}$ acyclic alkyl, a substituted or unsubstituted $C_1$-$C_{10}$ cyclic alkylene, a substituted or unsubstituted $C_1$-$C_{10}$ acyclic alkylene, a substituted or unsubstituted $C_1$-$C_{10}$ cyclic alkylidene, a substituted or unsubstituted $C_1$-$C_{10}$ acyclic alkylidene, or H; or an unsubstituted $C_1$-$C_{10}$ cyclic alkyl, an unsubstituted $C_1$-$C_{10}$ acyclic alkyl, an unsubstituted $C_1$-$C_{10}$ cyclic alkylene, an unsubstituted $C_1$-$C_{10}$ acyclic alkylene, an unsubstituted $C_1$-$C_{10}$ cyclic alkylidene, an unsubstituted $C_1$-$C_{10}$ acyclic alkylidene, or H; or an unsubstituted $C_1$-$C_{10}$ cyclic alkyl, an unsubstituted $C_1$-$C_{10}$ acyclic alkyl, or H; or an unsubstituted $C_1$-$C_{10}$ cyclic alkyl, or an unsubstituted $C_1$-$C_{10}$ acyclic alkyl; or an unsubstituted $C_1$-$C_{10}$ acyclic alkyl; and R4, R5, and R6 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, Rb is selected from methyl, ethyl, n-propyl, 2-propyl, n-butyl, isobutyl, or 2-butyl; and R4, R5, and R6 are each OR, wherein each R independently is selected from methyl, ethyl, n-propyl, 2-propyl, n-butyl, isobutyl, or 2-butyl.

In one embodiment, Compound F2 is selected from methyltrimethoxysilane or methyltriethoxysilane.

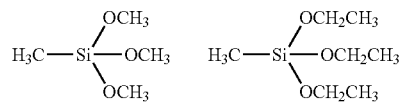

C) a Compound F3 selected from Formula 3:

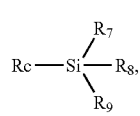
(Formula 3)

wherein Rc comprises more than one multiple bond, including C=C, C≡C, C=O, C=N, and C≡N, and these multiple bonds are in a conjugated configuration; and R7, R8, and R9 are each independently selected from alkoxyl, hydroxyl, halide, OC(O)R, or OC(O)OR, wherein R is an alkyl or a substituted alkyl. In a further embodiment, R is an alkyl.

In one embodiment, Rc comprises an aryl or substituted aryl, a conjugated diene or conjugated triene, a conjugated diketone, a conjugated keto-ester, an α,β-unsaturated ester, an α,β-unsaturated ketone, a nitrile in conjugation with an alkene, a nitrile in conjugation with an ketone, a nitrile in conjugation with an ester, an alkyne in conjugation with an alkene, an alkyne in conjugation with an ketone, or an alkyne in conjugation with an ester; and R7, R8, and R9 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, Rc comprises a phenyl group, a naphthyl group, an anthracene group, a phenanthrene group, a fluorene group, a pyridine group, a quinoline group, an imidazole group, a benzoimidazole group, an indole group, a carbazole group, a furan group, a benzofuran group, a dibenzofuran group, an acryloxyl group, an acrylamido group, a methacryloxyl group, or a methacrylamido group; and R7, R8, and R9 are each OR, wherein each R independently is selected from methyl, ethyl, n-propyl, 2-propyl, n-butyl, isobutyl, or 2-butyl.

In one embodiment, Compound F3 is selected from phenyltrimethoxysilane or phenyltriethoxysilane.

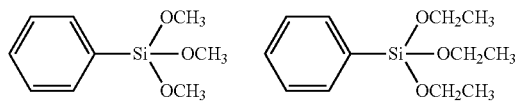

D) A Compound F4 selected from Formula 4:

$$R_{10}\text{—}\underset{\underset{R_{13}}{|}}{\overset{\overset{R_{11}}{|}}{Si}}\text{—}R_{12},\quad\text{(Formula 4)}$$

wherein R10, R11, R12, and R13 are each independently selected from alkoxyl, hydroxyl, halide, OC(O)R, or OC(O)OR, wherein R is an alkyl or a substituted alkyl. In a further embodiment, R is an alkyl.

In one embodiment, R10, R11, R12, and R13 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, R10, R11, R12, and R13 are OR, wherein each R independently is selected from methyl, ethyl, n-propyl, 2-propyl, n-butyl, isobutyl, or 2-butyl.

In one embodiment, Compound F4 is selected from tetramethyl orthosilicate or tetraethyl orthosilicate:

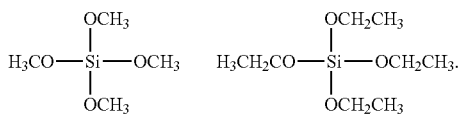

Tri-Layer Coatings

Tri-layer coatings, for example, tri-layer resists, typically comprise: (a) a curable underlayer composition on a substrate; (b) a hardmask composition (for example, a hardmask layer formed from an inventive composition described herein) applied above the curable composition; and (c) a photoresist composition layer applied above the hard mask composition. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed. Coating compositions and lithographic processes are described in U.S. Publication 2007/0238052 and U.S. Publication 2009/0148789, each incorporated herein by reference.

A variety of photoresists may be used in combination (i.e., overcoated) with an inventive coating composition of the present invention. Preferred photoresists include chemically-amplified resists, especially positive-acting or negative-acting photoresists that contain one or more photoacid generator compounds and a resin component that contains units that undergo a deblocking or cleavage reaction in the presence of photogenerated acid, such as photoacid-labile ester, acetal, ketal or ether units.

Negative-acting photoresists also can be employed with coating compositions of the invention, such as resists that crosslink (i.e., cure or harden) upon exposure to activating radiation. Preferred photoresists for use with a coating composition of the invention may be imaged with relatively short-wavelength radiation, e.g., radiation having a wavelength of less than 300 nm, or less than 260 nm, such as about 248 nm, or radiation having a wavelength of less than about 200 nm, such as 193 nm.

Suitable photoresists contain an imaging-effective amount of photoacid generator compounds and one or more resins. Suitable resins, include, but are not limited to, i) phenolic resin that contains acid-labile groups (for example, see U.S. Pat. Nos. 6,042,997 and 5,492,793); ii) polymers that contain polymerized units of a vinylphenol, an optionally substituted vinylphenyl (e.g., styrene) that does not contain a hydroxyl or carboxyl ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

Additional resins include resins that are substantially or completely free of phenyl or other aromatic groups, and that can provide a chemically amplified resist particularly suitable for imaging at sub-200 nm wavelengths such as 193 nm. Preferred resins of this class include: i) polymers that contain polymerized units of a non-aromatic cyclic olefin (endocyclic double bond) such as an optionally-substituted norbornene, such as polymers described in U.S. Pat. Nos. 5,843,624, and 6,048,664; ii) polymers that contain alkyl acrylate units, such as e.g. t-butyl acrylate, t-butyl methacrylate, methyladamantyl acrylate, methyladamantyl methacrylate, and other acyclic alkyl and alicyclic acrylates; such polymers have been described in U.S. Pat. No. 6,057,083; European Published Applications EP01008913A1 and EP00930542A1, and iii) polymers that contain polymerized anhydride units, particularly polymerized maleic anhydride and/or itaconic anhydride units, such as disclosed in European Published Application EP01008913A1 and U.S. Pat. No. 6,048,662.

Other resins include resins that contain repeat units that contain a heteroatom, particularly oxygen and/or sulfur (but other than an anhydride, i.e. the unit does not contain a carbonyl ring atom), and preferably is substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit, such as provided by polymerization of a maleic anhydride or itaconic anhydride. Also, resins that contain fluorine substitution (fluoropolymer), for example, as may be provided by polymerization of tetrafluoroethylene, a fluorinated aromatic group, such as fluorostyrene compound, and the like.

DEFINITIONS

The term "composition," as used herein, includes a mixture of materials which comprise the composition, as well as reaction products and decomposition products formed from the materials of the composition.

The term "polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure), and the term interpolymer as defined hereinafter.

The term "interpolymer," as used herein, refers to polymers prepared by the polymerization of at least two different types of monomers. The generic term interpolymer includes copolymers (employed to refer to polymers prepared from two different monomers), and polymers prepared from more than two different types of monomers.

The term "prepolymer," as used herein, refers to a polymer of molecular weight Mw (weight average), for example from about 500 g/mole to 100,000 μg/mole, preferably from 500 to 50,000 g/mole (as determined by conventional GPC, as described below).

The term "multiple bond" as used herein may refer to either a double bond or a triple bond.

The term "conjugated configuration" as used herein, refers to a configuration of multiple bonds that occurs in a compound, in which two multiple bonds are separated by one single bond, forming an alternating pattern (for example, "double bond-single bond-double bond" or "triple bond-single bond-double bond" or "double bond-single bond-triple bond"). In a conjugated configuration the multiple bonds may independently be double bonds or triple bonds. More than one alternating pattern may be present in a compound with a conjugated configuration of bonds. Examples of compounds with conjugated bonds are benzene, 1,4-butadiene, furan, acrylonitrile, and acrylic acid.

 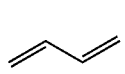  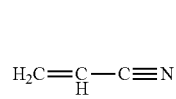

Benzene   1,4-Butadiene   Furan   Acrylonitrile

-continued

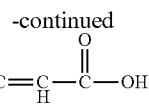

Acrylic Acid

The term "amine-containing compound" as used herein, refers to an organic compound containing at least one, and preferably one, amine group (for example, primary, secondary or tertiary amine ($NH_2$ or NH or N)).

The term "halide-containing compound," as used herein, refers to an organic compound containing at least one, and preferably one, halide group (for example, Cl, Br, F, and preferably Cl).

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed.

Test Methods

GPC

Molecular weight of the prepolymer was monitored by gel permeation chromatography (GPC), also referred to as size exclusion chromatography (SEC). The instrument was equipped with a set of columns appropriate for measuring molecular weights in the range of about 500 g/mole to at least about 100,000 g/mole, based on polystyrene calibration standards. Particularly effective was a set of two SHODEX LF-804 GPC columns, 8 mm diameter×300 mm length, available from Thomson Instrument Co., installed in series. The mobile phase was tetrahydrofuran, and it was pumped at a rate of 1 mL/min. The instrument was also equipped with a refractive index detector. Calibration was done using polystyrene standards, available from Polymer Standards Service GmbH, Mainz, Germany. The Mn, Mw, and MWD were calculated using the "GPC-addon" for ChemStation software, available from Agilent Technologies, Inc.

SEM

Both top-down and cross-section images were measured on a Hitachi CG 4000 SEM (Hitachi High Technologies America, Inc). Top-down measurements are performed on the entire imaged wafer. Cross sections are obtained by cleaving the wafer through the feature of interest, and sputter-coating the wafer piece with a thin layer of either gold or iridium.

EXPERIMENTAL

Materials used in this invention are obtained from commercial sources and used as received. The abbreviation and source of raw materials are:

VTMS: Vinyltrimethoxysilane (Sigma Aldrich, Dow Corning)

MTMS: Methyltrimethoxysilane (Sigma Aldrich, Dow Corning)

PTMS: Phenyltrimethoxysilane (Sigma Aldrich, Dow Corning)

TEOS: Tetraethyl orthosilicate (Sigma Aldrich, Dow Corning)

GlyTMS: Glycidoxypropyltrimethoxysilane (Sigma Aldrich, Dow Corning, Gelest)

PGMEA: Propylene glycol monomethyl ether acetate (DOWANOL PMA, The Dow Chemical Company)

BTEAC: Benzyltriethylammonium chloride (Sigma Aldrich)

3N aqueous acetic acid solution was prepared in the lab. Glacial acetic acid was supplied by JT Baker.

0.1N aqueous hydrochloric acid was prepared in the lab. Concentrated hydrochloric acid was supplied by Fisher.

Table 1 lists different first compositions that were used in this invention. Amounts are in mole percent, based on the total number of moles added to prepare the composition.

TABLE 1

Description of the First Composition

|  | V Formula-1 | M Formula-2 | Ph Formula-3 | TEOS Formula-4 | Gly Formula-5 |
|---|---|---|---|---|---|
| First Comp 1 | 15 | 46 | 9 | 30 | 0 |
| First Comp 2 | 15 | 41 | 9 | 35 | 0 |
| First Comp 3 | 15 | 36 | 9 | 40 | 0 |
| First Comp 4 | 15 | 26 | 9 | 50 | 0 |
| First Comp A | 89 | 5 | 6 | 0 | 0 |
| First Comp B | 46 | 22.5 | 8.5 | 0 | 23 |
| First Comp C | 0 | 71 | 9 | 20 | 0 |
| First Comp D | 0 | 61 | 9 | 30 | 0 |
| First Comp E | 80 | 0 | 20 | 0 | 0 |
| First Comp 5' | 36 | 50 | 9 | 5 | 0 |
| First Comp 6' | 56 | 30 | 9 | 5 | 0 |
| First Comp 7' | 34 | 20 | 6 | 40 | 0 |

Different prepolymers were synthesized using the above compositions as shown in Tables 2A and 2B. The detailed synthesis processes of the prepolymers are described in the paragraphs following Table 2B.

TABLE 2A

Description of Prepolymers

| Prepolymer 1 | Prepolymer 2 | Prepolymer 3 | Prepolymer 4 | Prepolymer 5 | Prepolymer 6 | Prepolymer 7 | Prepolymer 8 |
|---|---|---|---|---|---|---|---|
| First Comp 1 | First Comp 1 | First Comp 4 | First Comp 4 | First Comp 4 | First Comp 1 | First Comp 2 | First Comp 3 |

TABLE 2B

Description of Prepolymers Continued

| Prepolymer A' | Prepolymer B | Prepolymer C | Prepolymer D | Prepolymer E | Prepolymer 9' | Prepolymer 10' | Prepolymer 11' | Prepolymer 12' |
|---|---|---|---|---|---|---|---|---|
| First Comp A | First Comp B | First Comp C | First Comp D | First Comp E | First Comp 5' | First Comp 6' | First Comp 7' | First Comp 7' |

Synthesis of Inventive and Comparative Prepolymers

Prepolymer 1

A three-neck round-bottom flask, equipped with a mechanical stirrer and a short path distillation apparatus, was charged with glacial acetic acid (0.52 mL) and HPLC grade, submicron filtered water (20.52 mL) to form an acetic acid/water solution. A plastic syringe, equipped with a transfer line, was charged with a premixed solution of phenyltrimethoxysilane (6.16 g, 31.1 mmol), methyltrimethoxysilane (21.64 g, 158.8 mmol), vinyltrimethoxysilane (7.68 g, 51.8 mmol), tetraethyl orthosilicate (21.58 g, 103.6 mmol), and PGMEA (58.33 mL). The alkoxysilane monomer/PGMEA mixture was added dropwise to the acetic acid/water solution over a one hour period using a syringe pump. After addition, the syringe transfer line was removed from the round bottom flask inlet, and replaced with a thermocouple, fitted in a glass joint to monitor the internal reaction temperature. The reaction mixture was stirred at room temperature for 10 minutes. The flask was then placed in a temperature-controlled oil bath, and the bath temperature was set to reach a temperature of 100° C. The condensation reaction proceeded under a nitrogen atmosphere, while collecting alcohol and water by distillation. The reaction mixture was heated for two hours and 25 minutes. The concentrated reaction mixture was then diluted to approximately 20 wt % solids with PGMEA (42 mL) to a final weight of 127.4 g. The solution was filtered via 0.2 μm PTFE membrane filter.

The solids concentration was measured by drying 1 g sample in an oven at 110° C. The molecular weight was determined by GPC: Mw, 4152 g/mole; Mn, 1414 g/mole; MWD, 2.94.

Prepolymer 2

A three-neck round-bottom flask, equipped with a mechanical stirrer and a short path distillation apparatus, was charged with a premixed solution of phenyltrimethoxysilane (6.16 g, 31.1 mmol), methyltrimethoxysilane (21.64 g, 158.8 mmol), vinyltrimethoxysilane (7.68 g, 51.8 mmol), tetraethyl orthosilicate (21.58 g, 103.6 mmol), and PGMEA (58.33 mL). A plastic syringe, equipped with a transfer line, was charged with glacial acetic acid (0.52 mL) and HPLC grade, submicron filtered water (27.98 mL). The acetic acid/water solution was added to the alkoxysilane monomer/PGMEA mixture over a 30-minute period using a syringe pump. After addition, the syringe transfer line was removed from the round bottom flask inlet, and replaced with a thermocouple, fitted in a glass joint, to monitor the internal reaction temperature. The flask was placed in a temperature-controlled oil bath, and the bath temperature was set to reach a temperature of 100° C. The condensation reaction proceeded under a nitrogen atmosphere, while collecting alcohol and water by distillation. The reaction mixture was heated for two and a half hours. The concentrated reaction mixture was then diluted to approximately 20 wt % solids with PGMEA (42 mL) to a final weight of 127 g. The solution was filtered via 0.2 μm PTFE membrane filter. The solids concentration was measured by drying 1 g sample in an oven at 110° C. The molecular weight was determined by GPC: Mw, 4627 g/mole; Mn, 1709 G/mole; PDI, 2.71.

Prepolymer 3

A 250-mL three-neck round-bottom flask, equipped with a magnetic stirrer and a short path distillation apparatus, was charged with 3N acetic acid (34.21 g). A plastic syringe, equipped with a transfer line, was charged with a premixed solution of phenyltrimethoxysilane (8.82 g), methyltrimethoxysilane (17.49 g), vinyltrimethoxysilane (10.96 g), tetraethyl orthosilicate (51.36 g), and PGMEA (82 mL). The monomer solution was added slowly to the reaction flask using a syringe pump. After one hour from start of monomer addition, the flask was placed in a temperature-controlled oil bath, and the bath temperature was set to 100° C. After 3 hours the bath temperature was increased to 110° C., and held at this temperature, until the temperature in the reaction mixture reached 90° C. Then the oil bath was removed, and the polymer solution was allowed to cool. A second aliquot of PGMEA was added to adjust the polymer solution to 20 wt % solids. The solid content of the polymer solution was determined by heating a sample of the polymer solution in an oven at 145° C. for one hour. Molecular weight of the polymer was determined by GPC: Mw 3083 g/mole; Mn 1396 g/mole; MWD 2.21.

Prepolymer 4

A 500-mL three-neck round-bottom flask, equipped with a magnetic stirrer and a Dean Stark apparatus, was charged with glacial acetic acid (13.33 g) and water (59.98 g). A plastic syringe, equipped with a transfer line, was charged with a premixed solution of phenyltrimethoxysilane (18.86 g), methyltrimethoxysilane (37.41 g), vinyltrimethoxysilane (23.48 g), tetraethyl orthosilicate (110.04 g), and PGMEA (175.07 g). The monomer solution was added over 1 hour to the reaction flask using a syringe pump. The flask was placed in a temperature-controlled oil bath set to 100° C., and held at that temperature for one hour. Collection of distillate was started. Bath temperature was increased to 110° C., and held at this temperature, until the reaction temperature reached 90° C., at which point the heating bath was removed, and the polymer solution was allowed to cool. A second aliquot of PGMEA was added to adjust the polymer solution to 20 wt % solids. Solid content of the polymer solution was determined by heating a sample of the polymer solution in an oven at 145° C. for one hour. Molecular weight of the polymer was determined by GPC: Mw 2443 g/mole; Mn 1419 g/mole; MWD 1.72.

Prepolymer 5

A 250-mL three-neck round-bottom flask, equipped with a magnetic stirrer and a short path distillation apparatus, was charged with 3N acetic acid (34.5 g). A plastic syringe, equipped with a transfer line, was charged with a premixed solution of phenyltrimethoxysilane (8.81 g), methyltrimethoxysilane (17.46 g), vinyltrimethoxysilane (10.95 g), tetraethyl orthosilicate (51.36 g), and PGMEA (82 mL). The monomer solution was added slowly to the reaction flask using a syringe pump. After one hour from start of monomer addition, the flask was placed in a temperature-controlled oil bath, and the bath temperature was set to 100° C. After 3 hours the bath temperature was increased to 110° C., and held at this temperature, until the reaction temperature reached 90° C., at which point the oil bath was removed, and the polymer solution was allowed to cool. A second aliquot of PGMEA was added to adjust the polymer solution to 20 wt % solids. Solid content of the polymer solution was determined by heating a sample of the polymer solution in an oven at 145° C. for one hour. Molecular weight of the polymer was determined by GPC: Mw 2928 g/mole.

Prepolymer 6

Vinyltrimethoxysilane (11.1 g), phenyltrimethoxysilane (9 g), methyltrimethoxysilane (31.3 g), tetraethyl orthosilicate (31.1 g), and PGMEA (65 g) were combined and added to a glass syringe. To a 500-mL 3-neck, round-bottom flask, 3N acetic acid (23.9 g) was charged. An overhead stirrer provided mixing in the flask. The silanes/solvent blend was added to the flask at room temperature, using a syringe pump; total addition time was 70 minutes. After addition of the silanes, a Dean Stark trap and a nitrogen line were attached to the flask. The flask was placed in an oil bath, and the bath was heated to 100° C.; distillate was collected in the Dean Stark trap. After collecting distillate for 60 minutes, PGMEA (40 g) was slowly added to the flask. The oil bath was heated to 125° C., while still collecting distillate, which continued for an additional 70 minutes. A total of 57.8 g of distillate was collected. The flask was removed from the heat, and the Dean Stark trap removed. The weight average molecular weight was determined to be 2590 g/mole by GPC. The flask was placed back into the oil bath at 125° C. After 30 minutes at 125° C., a sample was taken from the flask, and the weight average molecular weight was determined to be about 3790 g/mole by GPC. Heating at 125° C. continued for an additional 30 minutes. The flask was removed from the oil bath. The weight average molecular weight was determined to be 5040 g/mole by GPC. The concentration of the resulting siloxane polymer solution was 23.46 wt %, based on the weight of solution.

Prepolymer 7

Vinyltrimethoxysilane (11.1 g), phenyltrimethoxysilane (9 g), methyltrimethoxysilane (27.9 g), tetraethyl orthosilicate (36.4 g), and PGMEA (65 g) were combined and added to a glass syringe. To a 500-mL, 3-neck round-bottom flask, 3N acetic acid (24.1 g) was charged. An overhead stirrer provided mixing in the flask. The silanes/solvent blend was added to the flask, at room temperature, using a syringe pump; total addition time was 60 minutes. After addition of the silanes, a Dean Stark trap and a nitrogen line were attached to the flask. The flask was placed in an oil bath heated to 100° C., and distillate was collected in the Dean Stark trap for 60 minutes. Then PGMEA (40 g) was slowly added to the flask. The oil bath was heated to 125° C., while still collecting distillate, which continued for an additional 60 minutes. A total of 55.1 g of distillate was collected. The flask was removed from the heat, and the Dean Stark trap removed. The weight average molecular weight was determined to be 3770 g/mole by GPC. The flask was placed back into the oil bath at 125° C. After 15 minutes at 125° C., the flask was removed from the oil bath and cooled. The weight average molecular weight was determined to be about 4505 g/mole by GPC. The flask was placed back into the oil bath at 125° C.; heating continued for an additional 16 minutes. The flask was removed from the oil bath. The weight average molecular weight was determined to be 5620 g/mole by GPC. The concentration of the resulting siloxane polymer solution was 27.29 wt %, based on the weight of the solution.

Prepolymer 8

Vinyltrimethoxysilane (11.1 g), phenyltrimethoxysilane (9 g), methyltrimethoxysilane (24.5 g), 41.6 g of tetraethyl orthosilicate (41.6 g), and PGMEA (65 g) were combined and added to a glass syringe. To a 500-mL, 3-neck round-bottom flask, 3N acetic acid (24.3 g) was charged. An overhead stirrer provided mixing in the flask. The silanes/solvent blend was added to the flask, at room temperature, using a syringe pump; total addition time was 62 minutes. After addition of the silanes, a Dean Stark trap and a nitrogen line were attached to the flask. The flask was placed in an oil bath heated to 100° C.; distillate was collected in the Dean Stark trap. After collecting distillate for 51 minutes, PGMEA (50 g) was slowly added to the flask. The oil bath was heated to 125° C., while still collecting distillate for an additional 45 minutes. A total of 52.5 g of distillate was collected. The flask was removed from the heat, and the Dean Stark trap removed. The weight average molecular weight was determined to be 3020 g/mole by GPC. The flask was placed back into the oil bath at 125° C. After 16 minutes at 125° C., the flask was removed from the oil bath and allowed to cool. The weight average molecular weight was determined to be about 3675 g/mole by GPC. The flask was placed back into the oil bath at 125° C.; heating continued for an additional 30 minutes. The flask was removed from the oil bath. The weight average molecular weight was determined to be 4960 g/mole by GPC. The flask was placed back into the oil bath at 125° C.; heating continued for an additional 15 minutes. The flask was removed from the oil bath. The weight average molecular weight was determined to be 5925 g/mole by GPC. The concentration of the resulting siloxane polymer solution was 23.01 wt %.

Prepolymer A

Vinyltrimethoxysilane (65.9 g), phenyltrimethoxysilane (5.9 g), and methyltrimethoxysilane (3.4 g) were combined and added to a glass syringe. To a 500-mL, 3-neck round-bottom flask, 3N acetic acid (27 g) was charged. An overhead stirrer provided mixing in the flask. The silanes were added to the flask using a syringe pump; total addition time was 45 minutes. After addition of the silanes, a Dean Stark trap and a nitrogen line were attached to the flask. The flask was placed in an oil bath heated to 100° C. After collecting distillate in the Dean Stark trap for 45 minutes, PGMEA (75 g) was slowly added to the flask. The oil bath was heated to 125° C., while collecting distillate for an additional 75 minutes. A total of 49.4 g of distillate was collected. The Dean Stark trap was removed from the flask. The oil bath was held at 125° C. for an additional 95 minutes; the flask was removed from the oil bath and heating discontinued. The flask was placed back into the oil bath at 125° C. for an additional 60 minutes. The flask was removed from the oil bath, and 35 g of PGMEA was added to the flask to help facilitate cooling. The weight average molecular weight of the resulting silsesquioxane polymer was determined to be about 4255 g/mole by GPC. The targeted weight average molecular weight was 5000 g/mole. The flask was placed back into the oil bath at 125° C. for an additional 61 minutes, and then removed from the oil bath to determine the molecular weight. The weight average molecular weight was determined to be 4625 g/mole by GPC. The flask was placed back into the oil bath at 125° C. for an additional 61 minutes, and then removed from the oil bath to determine the molecular weight. The weight average molecular weight was determined to be 5015 g/mole by GPC. The concentration of the resulting silsesquioxane polymer solution was 22.71 wt %.

Prepolymer B

Vinyltrimethoxysilane (13.6 g), phenyltrimethoxysilane (3.4 g), methyltrimethoxysilane (6.1 g), glycidoxypropyltrimethoxysilane (10.8 g) and PGMEA (80 g) were combined and added to a glass syringe. To a 250-mL, 3-neck round-bottom flask, 3N acetic acid (9.2 g) was charged. An overhead stirrer provided mixing in the flask. The silanes/solvent blend was added to the flask at room temperature using a syringe pump; total addition time was 70 minutes. After addition of the silanes, a Dean Stark trap and nitrogen line were attached to the flask. The flask was placed in an oil bath heated to 100° C. After collecting distillate in the Dean Stark for 43 minutes, PGMEA (40 g) was slowly added to the flask. The oil bath was heated to 125° C., while collecting distillate for an additional 68 minutes. A total of 12.3 g of distillate was collected. The flask was removed from the heat, and the Dean Stark trap removed. The weight average molecular weight was determined to be 645 g/mole by GPC. The flask was placed back into the oil bath at 125° C., and after 120 minutes, a sample was taken from the flask, and the weight average molecular weight was determined to be about 1130 g/mole by GPC. Heating continued for an additional 300 minutes. The flask was removed from the oil bath. The weight average molecular weight was determined to be 2050 g/mole by GPC. The flask was placed back into the oil bath for 420 minutes, after which the weight average molecular weight was determined to be 3460 g/mole by GPC. The flask was placed back into the oil bath for 420 minutes, after which the weight average molecular weight was determined to be 5480 g/mole by GPC. The concentration of the resulting silsesquioxane polymer solution was 14.03 wt %, based on weight of the solution.

Prepolymer C

A 3-neck, 250-mL flask was equipped with a temperature probe, a constant RPM overhead stirrer with a two inch Teflon paddle, and a syringe pump addition adapter. Distilled silane monomers phenyltrimethoxysilane (7.03 g, 35.4 mmol), methyltrimethoxysilane (38.12 g, 279.8 mmol), and tetraethyl orthosilicate (16.42 g, 78.8 mmol) were weighed into a plastic bottle, transferred to the reaction flask, and diluted with 65.5 mL of PGMEA. Hydrochloric acid (0.1N, 3.95 mL, 3.95 mmol) was diluted with HPLC-grade water (19.49 mL, 1082 mmol), mixed in a graduated cylinder, and then added dropwise over 30 minutes to the silane solution, by a syringe pump at ambient room temperature. Upon completion of the acid/water solution addition step, the syringe pump addition adapter was replaced with a short path distillation head fitted with a nitrogen line, after which, the solution was then heated by an oil bath with a set point of 110° C. After 15 minutes, the bath temperature set point was reduced to 100° C. Reaction aliquots (0.2 mL) were removed frequently, and diluted in THF (1.0 mL) to be analyzed by GPC. The polymer solution reached a molecular weight close to target (5000 g/mole) after heating for 75 minutes. The solution was diluted to 21.9 wt % solids, based on the total weight of the solution, with additional PGMEA (46.8 mL, 342 mmol), and cooled to room temperature. The solution was agitated over an excess equivalence of DOWEX MARATHON MR-3 mixed ion exchange resin, produced by Dow Chemical Co., and it was filtered through a "0.2 μm" PTFE syringe filter. The molecular weight was measured by GPC: Mw 4079 g/mole; Mn 1798 g/mole; MWD 2.27.

Prepolymer D

A 3-neck, 250-mL flask was equipped with a temperature probe, a constant RPM overhead stirrer with a two inch Teflon paddle, and a syringe pump addition adapter. Distilled silane monomers phenyltrimethoxysilane (7.08 g, 35.7 mmol), methyltrimethoxysilane (32.96 g, 242.0 mmol), and tetraethyl orthosilicate (24.79 g, 119.0 mmol) were weighed into a plastic bottle, transferred to the reaction flask, and diluted with charge 65.3 mL of PGMEA. Hydrochloric acid (0.1N, 0.40 mL, 0.04 mmol) was diluted with HPLC-grade water (23.2 mL, 1287 mmol), mixed in a graduated cylinder, and then added dropwise over 30 minutes to the silane solution, by a syringe pump at ambient room temperature. Upon completion of the acid/water solution addition step, the syringe pump addition adapter was replaced with a short path distillation head fitted with a nitrogen line. The materials were mixed for 60 minutes, at ambient temperature, following the 30 minute acid addition time, after which, the solution was then heated by an oil bath with a set point of 100° C. After 5 hours, the bath temperature set point was increased to 120° C. Reaction aliquots (0.2 mL) were removed frequently, and diluted in THF (1.0 mL) to be analyzed by GPC. The polymer solution reached a molecular weight close to target (5000 g/mole) after heating for 6 hours. The solution was diluted to 22.4 wt % solids with additional PGMEA (45.5 mL), and cooled to room temperature. The polymer solution was agitated over an excess equivalence of DOWEX MARATHON MR-3 mixed ion exchange resin. The solution was filtered through a "0.2 µm" PTFE syringe filter, and was stored in a freezer at approximately 15 wt % solids. The molecular weight was measured by GPC: Mw 7782 g/mole; Mn 2294 g/mole; MWD 3.39.

Prepolymer E

A 250 mL, 3 neck round bottom flask was placed in a 20° C. water bath. The flask was fitted with a stirrer connected to an air motor, a water jacketed condenser, a thermocouple connected to a temperature controller, and an addition funnel. Acidified water (21.6 g, 1.2 moles, 3N acetic acid) was added to the flask. Vinyltrimethoxysilane (53.3 g, 0.360 moles) and phenyltrimethoxysilane (7.94 g, 0.040 moles) were pre-mixed, and added to the addition funnel. The silanes were added to the reactor over 45 minutes. After the addition was completed, the water bath was removed, and a heating mantle placed under the flask. The addition funnel was removed, and a Dean Stark trap and a nitrogen sweep line were attached. The solution was slowly heated in an oil bath set at 100° C. While heating, distillate was collected in the trap. When the reaction reached 100° C., 100 g of PGMEA was added. The oil bath was slowly heated to 125° C., while collecting additional distillate. When the bath temperature reached 125° C., the trap was removed. After three hours, the heating was discontinued, 75 g of PGMEA was added, and the solution was mixed until it had cooled to room temperature.

Prepolymer 6'

A 3-neck, 250-mL flask was equipped with a temperature probe, a constant RPM overhead stirrer with a two inch TEFLON paddle, and a syringe pump addition adapter.

Distilled silane monomers phenyltrimethoxysilane (7.91 g, 39.9 mmol), methyltrimethoxysilane (18.10 g, 132.9 mmol), vinyltrimethoxysilane (36.74 g, 247.9 mmol), and tetraethyl orthosilicate (4.61 g, 22.1 mmol) were weighed into a plastic bottle, transferred to the reaction flask, and diluted with 81.65 mL of PGMEA. Glacial acetic acid (5.5 mL, 94 mmol) was diluted with HPLC-grade water (21.9 mL, 1215 mmol), mixed in a graduated cylinder, and then added dropwise over 60 minutes to the silane solution, by a syringe pump at ambient room temperature. Upon completion of the acid/water solution addition step, the syringe pump addition adapter was replaced with a short path distillation head fitted with a nitrogen line. The materials were mixed for 60 minutes, at ambient temperature, following the 60 minute acid addition time, after which, the solution was then heated by an oil bath with a set point of 100° C. Reaction aliquots (0.2 mL) were removed frequently, and diluted in THF (1.0 mL) to be analyzed by GPC. The polymer solution reached a molecular weight close to target (5000 g/mole) after heating for 9.5 hours. The solution was diluted to 21.0 wt % solids with additional PGMEA (58.3 mL), and cooled to room temperature. The resin solution was filtered through a "0.2 µm" PTFE syringe filter, and the polymer solution was stored in a freezer at approximately 20 wt % solids. The molecular weight was measured by GPC: Mw 4527 g/mole; Mn 1793 g/mole; MWD 2.52.

Prepolymer 7'

A 3-neck, 500-mL flask was equipped with a temperature probe, a constant RPM overhead stirrer with a two inch Teflon paddle, and a syringe pump addition adapter. Distilled silane monomers phenyltrimethoxysilane (11.65 g, 58.7 mmol), methyltrimethoxysilane (44.42 g, 326.0 mmol), vinyltrimethoxysilane (34.85 g, 234.7 mmol) and tetraethyl orthosilicate (6.79 g, 32.6 mmol) were weighed into a plastic bottle, transferred to the reaction flask, and diluted with 116.7 mL of PGMEA. Glacial acetic acid (8.10 mL, 138 mmol) was diluted with HPLC-grade water (32.3 mL, 1792 mmol), mixed in a graduated cylinder, and then added dropwise over 60 minutes to the silane solution, by a syringe pump at ambient room temperature. The syringe pump addition adapter was replaced with a short path distillation head, fitted with a nitrogen line, upon completion of the acid/water solution addition step. The materials were mixed for 60 minutes at ambient temperature following the 60 minute acid addition time, after which, the solution was then heated by an oil bath with a set point of 100° C. Reaction aliquots (0.2 mL) were removed frequently, and diluted in THF (1.0 mL) to be analyzed by GPC. The polymer solution reached a molecular weight close to target (5000 g/mole) after heating for 10.5 hours. The solution was diluted to 22.3 wt % solids with additional PGMEA (83.3 mL), and cooled to room temperature. The resin solution was filtered through a "0.2 µm" PTFE syringe filter, and the polymer solution was stored in a freezer at approximately 20 wt % solids. The molecular weight was measured by GPC; Mw 4384 g/mole; Mn 1722 g/mole; MWD 2.55.

Prepolymer 8'

A 250-mL, three-neck round-bottom flask, equipped with a magnetic stirrer and a short path distillation apparatus, was charged with phenyltrimethoxysilane (4.86 g), methyltrimethoxysilane (22.24 g), and vinyltrimethoxysilane (20.57 g). A solution of glacial acetic acid (5.15 g) and water (23.53 g) was added to the flask, and stirring was started. Then tetraethyl orthosilicate (17.01 g) was added, and the mixture was stirred at room temperature for 60 minutes. The initially phase-separated reaction mixture homogenized, as hydrolysis progressed, to give a clear solution, and an exotherm was observed. PGMEA (70 g) was added, and the flask was placed in a temperature-controlled oil bath. The oil bath was heated to 100° C. for one hour, then increased to 110° C. for one hour, and then increased to 120° C. When the temperature of the reaction mixture reached 100° C., the heating bath was removed, and the polymer solution was allowed to cool. A second aliquot of PGMEA was added to adjust the polymer solution to 20 wt % solids. The solid content of the polymer solution was determined by heating a small sample of the polymer solution in an oven at 145° C. for one hour. Molecular weight of the polymer was determined by GPC: Mw 2071; Mn 1268; MWD 1.63.

Prepolymer 9'

A 250-mL, three-neck round-bottom flask, equipped with a magnetic stirrer and a short path distillation apparatus, was charged with phenyltrimethoxysilane (4.84 g), methyltrimethoxysilane (22.24 g), and vinyltrimethoxysilane (20.58 g). A solution prepared from "0.1N HCl (0.41 g)" and water (23.22 g) was added to the flask, and stirring was started. Then tetraethyl orthosilicate (17.02 g) was added, and the mixture was stirred at room temperature for 60 minutes. The initially phase separated reaction mixture homogenized, as hydrolysis progressed, to give a clear solution, and an exotherm was observed. PGMEA (50 g) was added, and the flask was placed in a temperature-controlled oil bath. The oil bath was heated to 100° C. for one hour, then increased to 110° C. for one hour, and then increased to 120° C. When the temperature of the reaction mixture reached 100° C., the heating bath was removed, and the polymer solution was allowed to cool. A second aliquot of PGMEA was added to adjust the polymer solution to 20 wt % solids. Residual acid was removed by passing the polymer solution through an ion exchange column packed with AMBERLITE IRN 150 mixed bed ion exchange resin, produced by The Dow Chemical Company. The solid content of the polymer solution was determined by heating a small sample of the polymer solution in an oven at 145° C. for one hour. Molecular weight of the polymer was determined by GPC: Mw 2925; Mn 1540; MWD 1.9.

Formation of the Second Compositions

All of the second compositions, except the Second Composition 9', were formed following the general procedure described here unless otherwise noted.

The designated prepolymer (37.5 g), BTEAC (0.37 g), and PGMEA (263 g) were added to a plastic bottle, mixed well, and filtered through a 0.2 μm PVDF filter, to form the respective second composition.

For the Second Composition 9', the Prepolymer 8 (37.5 g) and PGMEA (263 g) were added to a plastic bottle, mixed well, and filtered through "0.2 μm" PVDF filter to form Second Composition 9'. Table 3 summarizes all of the second compositions used in this study.

TABLE 3

Description of the Second Composition

| Second Composition | First Composition | Prepolymer | BTEAC |
|---|---|---|---|
| Second Comp 1 | First Comp 1 | Prepolymer 1 | Yes |
| Second Comp 2 | First Comp 1 | Prepolymer 2 | Yes |
| Second Comp 3 | First Comp 4 | Prepolymer 3 | Yes |
| Second Comp 4 | First Comp 4 | Prepolymer 4 | Yes |
| Second Comp 5 | First Comp 4 | Prepolymer 5 | Yes |
| Second Comp 6 | First Comp 1 | Prepolymer 6 | Yes |
| Second Comp 7 | First Comp 2 | Prepolymer 7 | Yes |
| Second Comp 8 | First Comp 3 | Prepolymer 8 | Yes |
| Second Comp A | First Comp A | Prepolymer A | Yes |
| Second Comp B | First Comp B | Prepolymer B | Yes |
| Second Comp C | First Comp C | Prepolymer C | Yes |
| Second Comp D | First Comp D | Prepolymer D | Yes |
| Second Comp E | First Comp E | Prepolymer E | Yes |
| Second Comp 9' | First Comp 3 | Prepolymer 8 | No |
| Second Comp 10' | First Comp 5' | Prepolymer 9' | Yes |
| Second Comp 11' | First Comp 6' | Prepolymer 10' | Yes |
| Second Comp 12' | First Comp 7' | Prepolymer 11' | Yes |
| Second Comp 13' | First Comp 7' | Prepolymer 12' | Yes |

Formation of the ArF Positive Tone Development (PTD) Photoresist

A suitable positive tone development photoresist is formed from the following mixture: 28.60 g propyleneglycol methylether acetate, 19.30 g cyclohexanone, 48.25 g hydroxybutyrate methyl ester, 3.02 g copolymer of isopropyl-adamantylmethacrylate, methylcyclopentylmethacrylate, (3aR,4s,5R,7S,7aR)-3-oxooctahydro-4,7-epoxy-isobenzofuran-5-yl methacrylate, hydroxyadamantylmethacrylate with a mole ratio of 20/20/30/20/10 respectively and weight average molecular weight of 9,000, 0.46 g (4-(tert-butyl)phenyl) diphenylsulfonium 1,1-difluoro-2-(((1r,3s,5R,7S)-3-hydroxyadamantan-1-yl)methoxy)-2-oxoethanesulfonate, 0.04 g tert-butyl(1,3-dihydroxy-2-(hydroxymethyl)-propan-2-yl) carbamate, and 0.01 g PolyFox 656 fluorinated surface leveling agent.

Formation of the ArF Negative Tone Development (NTD) Photoresist

A suitable negative tone development photoresist is formed from the following mixture: 28.95 g propyleneglycol methylether acetate, 19.30 g cyclohexanone, 48.25 g hydroxybutyrate methyl ester, 2.89 g copolymer of (2,2-dimethyl-1,3-dioxolan-4-yl)methyl methacrylate, 5-(2,2-dimethyl-1,3-dioxolan-4-yl)-2,2-dimethyltetrahydrofuro[2,3-d][1,3] dioxol-6-yl methacrylate, methyl adamantly methacrylate/5-oxo-4-oxa-tricyclonon-2-yl oxycarbonylmethyl methacrylate, hydroxyadamantylacrylate with a mol ratio of 25/25/40/10 respectively and weight average molecular weight of 22,000, 0.49 g triphenyl-sulfonium-1,1,2,2-tetrafluoro-4-((4-(13-methyl-3,7,12-trioxohexadecahydro-1H-cyclopenta[a]phenanthren-17-yl)pentanoyl)oxy)butane-1-sulfonate, 0.07 g polymer of n-butylmethacrylate with a weight average molecular weight of 10,000, 0.05 dodecyldiethanol-amine, and 0.01 g PolyFox 656 fluorinate surface leveling agent.

Formation of the Single Layer Coating

In a clean-room environment (about 72° F., about 50% RH, class 100), unprimed "200 mm" diameter silicon wafers from WaferNet Inc., were used as substrates. Onto a Si wafer, a second composition was hand dispensed, and spin coated on a Tokyo Electron (TEL) ACT-8 coat track to a nominal film thickness of 35 nm (as measured on a THERMA-WAVE spectroscopic ellipsometer). The coated wafer was baked at 240° C. for 60 seconds. Single layer coatings are summarized in Tables 4A, 4B and 4C.

TABLE 4A

Description of Single Layer Coatings

| | Single Layer 1 | Single Layer 2 | Single Layer 3 | Single Layer 4 | Single Layer 5 | Single Layer 6 |
|---|---|---|---|---|---|---|
| Second Composition | Second Comp 1 | Second Comp 2 | Second Comp 3 | Second Comp 4 | Second Comp 5 | Second Comp 6 |

TABLE 4B

Description of Single Layer Coatings Continued

| | Single Layer 7 | Single Layer 8 | Single Layer 10' | Single Layer 11' | Single Layer 12' | Single Layer 13 |
|---|---|---|---|---|---|---|
| Second Composition | Second Comp 7 | Second Comp 8 | Second Comp 10' | Second Comp 11' | Second Comp 12' | Second Comp 13' |

TABLE 4C

Description of Single Layer Coatings Continued

| Single Layer A | Single Layer B | Single Layer C | Single Layer D |
|---|---|---|---|
| Second Comp C | Second Comp D | Second Comp A | Second Comp E |

Test Methods on Single Layer Coating

Measurement of Optical Properties (m, k at 193 nm) and Film Thickness

The optical properties and thickness of the films were measured using a WOOLAM VUV-VASE VU-302 ellipsometer (Woolam, Nebr.). Films were coated on "200 mm" diameter bare silicon wafers, as described above in the single layer coating section. Polarization data was collected at three angles over a range of wavelengths from 170 nm to 900 nm. The data was automatically generated to obtain the thickness of the film and the refractive index (n, k) at 193 nm, where n is the real part of the complex refractive index and k is the imaginary part of the complex refractive index.

Table 5 summarizes the refractive index n, k at 193 nm of the inventive and comparative examples. The minimization of the reflection depends on the optical constants and thickness of the antireflective layer. With the desired thickness between 20 nm and 50 nm, the computer simulations, using PROLITH software V10.0 (KLA—Tencor Corporation) indicate that at 193 nm, n is no less than 1.67 and k is from 0.15 to 0.3, in order to reduce the reflection to less than 0.5%. As shown in Table 5, all of the inventive examples have n values and k values within the required range, and the two comparative examples each has an n value lower than what is needed. Thus inventive examples can provide good performance in controlling reflection, and are thus good antireflective layers, while the comparative examples are inferior in this respect.

TABLE 5

Optical Properties of the Inventive and Comparative Examples

| Inventive | Inventive | n | k |
|---|---|---|---|
| Example 1 | Single Layer 1 | 1.67 | 0.21 |
| Example 2 | Single Layer 2 | 1.68 | 0.22 |
| Example 3 | Single Layer 3 | 1.69 | 0.23 |
| Example 4 | Single Layer 4 | 1.68 | 0.22 |
| Example 5 | Single Layer 5 | 1.68 | 0.22 |
| Example 6 | Single Layer 6 | 1.67 | 0.21 |
| Example 7 | Single Layer 7 | 1.67 | 0.20 |
| Example 8 | Single Layer 8 | 1.67 | 0.20 |
| Comparative | Comparative | | |
| Comparative Example A | Single Layer A | 1.65 | 0.19 |
| Comparative Example B | Single Layer B | 1.66 | 0.19 |

Measurement of Water Contact Angle

Single layer coatings, as discussed above, were analyzed within one hour of coating. A DATAPHYSICS Instruments GmbH, model OCA20 goniometer was used for all contact angle measurements. Deionized water was used as the test liquid. A one microliter drop was used for each contact angle determination. After the drop was dispensed on the surface of the single layer coating, the drop motion was recorded for a minimum of ten seconds for each measurement, using the goniometer camera, at a minimum rate of three frames/second. The first drop image, when the goniometer needle had been completely removed from the field of view and no drop motion was present, was used to determine the contact angle. The contact angle was evaluated using a circular model in the OCA software. A minimum of three separate measurements were made across a single layer coating (three drops per single layer coating). Typical standard deviations for contact angle measurements are about 0.2 degrees.

Table 6 summarizes the water contact angle results of the inventive and comparative examples. The film quality is critical in order to obtain a good pattern during the photolithography process. The inventive layer is likely to be used in a multilayer scheme, where there will be another layer coated on top of the inventive layer. If the surface energy of the inventive layer is too low, as indicated by high water contact angle, defects such as dewets, which arise when the film does not fully cover the coated area, can appear in a film layer above the inventive layer. In order to minimize the surface defects of the adjacent layers, the water contact angle of an inventive layer is preferably less than 87°. As shown in Table 6, all the inventive examples have water contact angles less than the contact angles of the comparative examples, and Inventive Examples 1-8 have contact angles less than 87°. In comparison, the comparative examples C and D have water contact angles of 90°, 93°, respectively.

TABLE 6

Water Contact Angle of the Inventive and Comparative Examples

| Inventive | Inventive | water CA |
|---|---|---|
| Example 1 | Single Layer 1 | 80 |
| Example 2 | Single Layer 2 | 79 |
| Example 3 | Single Layer 3 | 70 |
| Example 4 | Single Layer 4 | 79 |
| Example 5 | Single Layer 5 | 77 |
| Example 6 | Single Layer 6 | 83 |
| Example 7 | Single Layer 7 | 77 |
| Example 8 | Single Layer 8 | 75 |
| Example 9' | Single Layer 9' | 87.5 |
| Example 10' | Single Layer 10' | 88.6 |
| Comparative | Comparative | |
| Comparative Example C | Single Layer C | 90 |
| Comparative Example D | Single Layer D | 93 |

Formation of the Bi-Layer Coatings

Films were coated as described in the formation of the single layer coating section. Then the ArF PTD Photoresist was applied to the coated wafers by spin coating, and the coated wafers were soft-baked 100° C. for 60 seconds, to achieve a photoresist film thickness of 100 nm (as measured on a Therma-Wave spectroscopic ellipsometer). A summary of the bi-layers is provided in Table 7.

TABLE 7

Description of Bi-layers

| Inventive example | Inventive Bi-layer | Second Composition |
|---|---|---|
| Example 13 | Bi-layer 1 | Second Comp 1 |
| Example 14 | Bi-layer 2 | Second Comp 2 |
| Example 15 | Bi-layer 3 | Second Comp 3 |
| Example 16 | Bi-layer 4 | Second Comp 4 |
| Example 17 | Bi-layer 5 | Second Comp 5 |
| Example 18 | Bi-layer 6 | Second Comp 6 |
| Example 19 | Bi-layer 7 | Second Comp 7 |
| Example 20 | Bi-layer 8 | Second Comp 8 |
| Comparative example | Comparative Bi-layer | |
| Comparative Example E | Bi-layer A | Second Comp A |
| Comparative Example F | Bi-layer B | Second Comp E |

Evaluation of the Adhesion of Bi-Layer Coatings

After bi-layer coatings were formed, the adhesion test was carried out. The adhesion test used tape pull with reference to ASTM D3359. First, a piece of Scotch tape (3M, MN) was firmly pressed onto the ArF PTD Photoresist coating. The length of the adhered section was one inch, and the remaining connecting free section was at least one inch. The free section of the tape was gripped by two fingers and pulled back quickly at an angle against the coating surface of about 270°. After the tape pull, the coating remaining was visually examined, and the area of the coating that was transferred to the tape was estimated as a percentage of the surface area of the tape that was adhered to the coating. A "0% peel" represented good adhesion, while "100% peel" indicated adhesion failure. The test was repeated at least five times, and the average of the area of adhered coating was reported, as shown in Table 8.

The tri-layer coating for pattern lithography needs to have a good interlayer adhesion. If the adhesion is weak, delamination can occur during the lithography, or pattern collapse can occur when the adhesive force is less than the different types of forces, such as residual forces, thermal stress, solvent swelling stress, and capillary force. Table 8 shows that all of the inventive examples have good adhesion, while the comparative examples have poor interlayer adhesion.

TABLE 8

Adhesion Measurement Results of the Inventive and Comparative Examples

|  |  | Dry Adhesion |
| --- | --- | --- |
| Example 13 | Bi-layer 1 | 0% Peel |
| Example 14 | Bi-layer 2 | 0% Peel |
| Example 15 | Bi-layer 3 | 0% Peel |
| Example 16 | Bi-layer 4 | 0% Peel |
| Example 17 | Bi-layer 5 | 0% Peel |
| Example 18 | Bi-layer 6 | 0% Peel |
| Example 19 | Bi-layer 7 | 0% Peel |
| Example 20 | Bi-layer 8 | 0% Peel |
| Comparative Example E | Tri-layer A | 100% Peel |
| Comparative Example F | Tri-layer B | 100% Peel |

Formation of the Tri-Layer Coatings

An inventive layer was used in a tri-layer scheme to examine the lithographic performance. The general structure of the tri-layer is shown in FIG. 1.

Formation of the Underlayer

An organic poly(methacrylate)-based underlayer coating composition was applied to a "300 mm" diameter silicon wafer, available from WaferNet, Inc., by spin coating, and the coated wafer was baked at 240° C. for 60 seconds, to achieve a film thickness of 135 nm. Suitable underlayer coating compositions include AR26N, available from Dow Chemical Company.

Formation of the Inventive Layer on the Underlayer

Coating compositions of the present invention, described in Table 9, were applied to the underlayer-coated wafer from the previous step by spin coating. Each coating was baked at 240° C. for 60 seconds to achieve an inventive film thickness of 35 nm.

Formation of the Tri-Layer

ArF Photoresist (both PTD and NTD as described previously) was applied to the coated wafers, from the previous step, by spin coating, and the coated wafer was soft baked at 100° C. for 60 seconds, to achieve a photoresist film thickness of 100 nm. To the PTD Photoresist coating, a top coat may be applied to provide for leaching control that is desirable for "193 nm" immersion lithographic processing. Suitable top coats include OC2000 from Dow Chemical Company.

TABLE 9

Description of Tri-layer Coatings

| Tri-layer 1 | Tri-layer 2 | Tri-layer 3 | Tri-layer 4 | Tri-layer A | Tri-layer B |
| --- | --- | --- | --- | --- | --- |
| Second Comp 1 | Second Comp 8 | Second Comp 6 | Second Comp 3 | Second Comp B | Second Comp B |

Formation of Lithographic Pattern

Lithographic Processing

The formed tri-layer coatings were processed according to the following steps:

1) Exposure: the applied photoresist layer was exposed to patterned 193 nm radiation, using an ASML 1900i;

2) Post-Exposure Bake: 120° C. for 60 seconds;

3) Development: the latent image was developed with 0.26N aqueous alkaline developer to provide a positive photoresist relief image, or with a suitable organic solvent (such as OSD-1000 Organic Solvent Developer from Dow Chemical Company) to provide a negative photoresist relief image.

Evaluation of the Lithographic Performance of Tri-Layer Coatings

Figure 2:
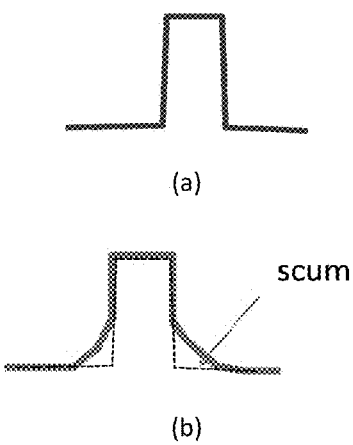
FIG. 2 is a drawing of the cross section views of a line pattern generated after lithographic process, illustrating the following: (a) a perfect square pattern; and (b) a defective pattern that has scum.

FIG. 2 depicts schematics of two photoresist line cross sections. The desired photoresist line cross section is shown in FIG. 2a. The cross section shows a square profile. An undesirable cross section profile is shown in FIG. 2b. The undesirable cross section exhibits an increase in CD (critical dimension) at the feature bottom. This profile defect is commonly referred to as footing or scum.

Figure 3:
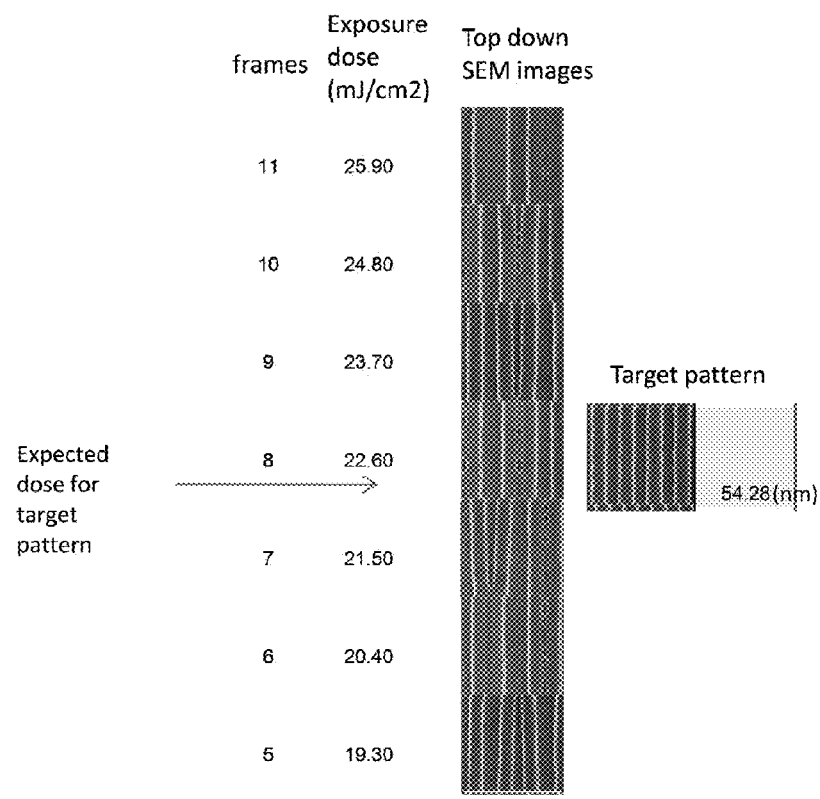
FIG. 3 depicts "top-down" SEM images of wafer surfaces after a lithography process illustrating a complete pattern collapse.
Figure 4:
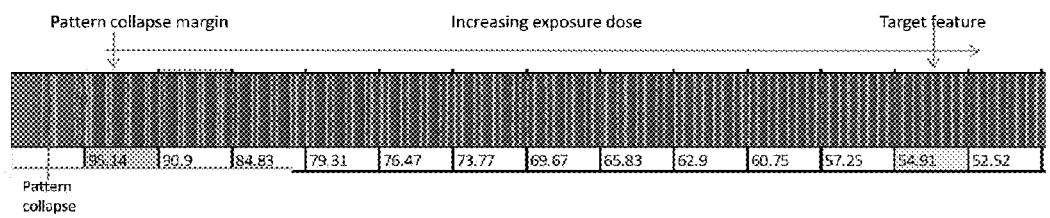
FIG. 4 is a "top-down" SEM image of a wafer surface after a lithography process illustrating a Pattern Collapse Margin.

Another aspect of photoresist performance is the "Pattern Collapse Margin." It is desirable to be able to obtain very small line-space patterns, while preventing, or reducing, the "fall over," or collapse, of such small line-space patterns. Hardmask compositions that do not provide adequate adhesion to the photoresist can result in pattern collapse, as shown in the top-down SEM images in FIG. 3. FIG. 4 illustrates the quantitative definition of Pattern Collapse Margin. The numbers in this figure are the width of the trench in a "140 nm pitch pattern." The higher the Pattern Collapse Margin, the narrower the width of the standing lines, and thus the better the lithographic performance, in terms of the minimum dimension, that can be formed.

Figure 5:
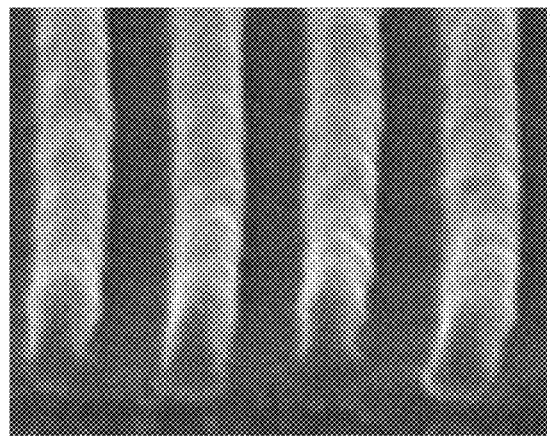
FIG. 5 is an SEM image of a lithographic pattern without scum (Example 16, 42 nm trench/84 nm pitch).
Figure 6:
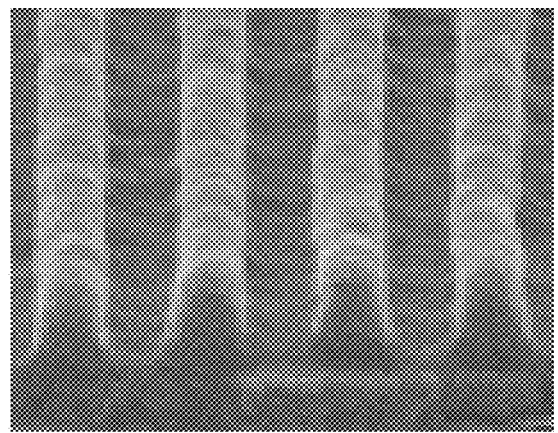
FIG. 6 is an SEM image of a lithographic pattern with scum (Comparative Example G, 42 nm trench/84 nm pitch).

It is highly desirable to obtain, after a lithographic process, a photoresist pattern that is without scum, and which has a high Pattern Collapse Margin. Table 10 compares the profile cleanliness (lack of scum) of the inventive and comparative examples. FIG. 5 shows that Inventive Example 16 had a square profile without scum, while scum was observed in the profile of Comparative Example G, as shown in FIG. 6. Table 11 compares the Pattern Collapse Margin of the inventive and comparative examples. As shown in this table, the inventive examples had a good pattern collapse margin, while the comparative example had complete pattern collapse.

TABLE 10

Lithography Patterning Performance of the Inventive and Comparative Examples

| Example | Tri-layer | Developing mode | Scum | Image |
| --- | --- | --- | --- | --- |
| Example 21 | Tri-layer 1 | Positive Developing | no | FIG. 5 |
| Example 22 | Tri-layer 2 | Positive Developing | no |  |
| Comparative Example G | Tri-layer A | Positive Developing | yes | FIG. 6 |

TABLE 11

Lithography Patterning Performance of the
Inventive and Comparative Examples

| | Developing Mode | Scum | Pattern Collapse Margin (nm) |
|---|---|---|---|
| Inventive | Inventive | | |
| Example 23 | Tri-layer 3 Negative developing | no | 85 |
| Example 24 | Tri-layer 4 Negative developing | no | 95 |
| Comparative | Comparative | | |
| Comparative Example H | Tri-layer B Negative developing | | complete pattern collapse |

The invention claimed is:

1. A first composition comprising at least the following:

A) a Compound F1 selected from Formula 1:

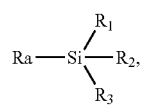

(Formula 1)

wherein Ra comprises one or more multiple bonds, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl; and B) a Compound F2 selected from Formula 2:

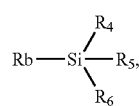

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl; and C) a Compound F3 selected from Formula 3:

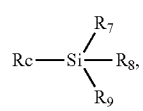

(Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and D) A Compound F4 selected from Formula 4:

(Formula 4)

wherein R10, R11, R12, and R13 are each independently selected from alkoxyl, hydroxyl, halide, OC(O)R, or OC(O)OR, wherein R is alkyl or a substituted alkyl; and wherein Compound F1 is present in an amount greater than 10 mole percent, based on the sum moles of Compounds F1, F2, F3 and F4; and wherein the molar ratio of F1/F4 is from 1/20 to 1/1.

2. The first composition of claim 1, comprising greater than, or equal to, 5 weight percent Si, based on the sum weight of Compounds F1, F2, F3 and F4.

3. The first composition of claim 1, wherein the sum molar amount of Compound F2 and Compound F4 is greater than, or equal to, 40 mole percent, based on the sum moles of Compounds F1, F2, F3 and F4.

4. The first composition of claim 1, wherein Compound F4 is present in an amount greater than 10 mole percent, based on the sum moles of Compounds F1, F2, F3 and F4.

5. The first composition of claim 1, wherein Compound F4 is present in an amount less than 65 mole percent, based on the sum moles of Compounds F1, F2, F3 and F4.

6. A prepolymer formed from the first composition of claim 1.

7. A second composition comprising the prepolymer of claim 6, and at least one of the following: an amine-containing compound, a halide-containing compound, a hydrochloride, an ammonium-containing compound, or a mixture thereof.

8. A crosslinked composition formed from the second composition of claim 7.

9. An article comprising at least one component formed from the composition of claim 1.

10. A film comprising at least one layer formed from the composition of claim 1.

11. The film of claim 10, further comprising a second layer formed from a third composition comprising a polymer.

12. A method of forming a coating on a substrate, said method comprising at least the following: providing a substrate, forming an underlayer on the substrate, wherein the underlayer comprises at least one polymer, applying the first composition of claim 1 or a second composition of claim 7 over the underlayer, and curing the first composition or second composition to form the coating; and wherein the second composition comprises a prepolymer formed from the first composition.

13. The method of claim 12, wherein multiple layers of the first composition or second composition are applied over the underlayer.

14. The method of claim 12, wherein the coating is an antireflective layer.

15. The first composition of claim 1, wherein the molar ratio of F1/F4 is from 1/15 to 1/1.

16. The first composition of claim 1, wherein the molar ratio of F1/F4 is from 1/10 to 1/1.

17. The composition of claim 1, wherein Compound F4 is present in an amount from 10 to 60 mole percent, based on the sum moles of Compounds F1, F2, F3 and F4.

18. The composition of claim 1, wherein Compound F1 is present in an amount from 5 to 50 weight percent; Compound F2 is present in an amount from 5 to 50 weight percent; Compound F3 is present in an amount from 2 to 20 weight percent; and Compound F4 is present in an amount from 20 to 80 weight percent; and wherein each weight percentage is based on the weight of the first composition.

19. A first composition comprising at least the following:
A) a Compound F1 selected from Formula 1:

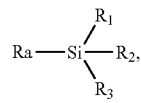

(Formula 1)

wherein Ra comprises one or more multiple bonds, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl; and B) a Compound F2 selected from Formula 2:

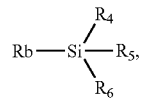

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl; and C) a Compound F3 selected from Formula 3:

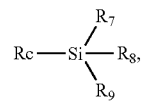

(Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and D) A Compound F4 selected from Formula 4:

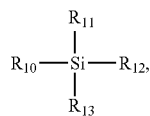

(Formula 4)

wherein R10, R11, R12, and R13 are each independently selected from alkoxyl, hydroxyl, halide, OC(O)R, or OC(O)OR, wherein R is alkyl or a substituted alkyl; and wherein Compound F1 is present in an amount greater than 10 mole percent, based on the sum moles of Compounds F1, F2, F3 and F4; and wherein Compound F1 is present in an amount from 5 to 50 weight percent; Compound F2 is present in an amount from 5 to 50 weight percent; Compound F3 is present in an amount from 2 to 20 weight percent; and Compound F4 is present in an amount from 20 to 80 weight percent; and wherein each weight percentage is based on the weight of the first composition.

* * * * *